(12) United States Patent
Smit et al.

(10) Patent No.: US 7,158,771 B2
(45) Date of Patent: Jan. 2, 2007

(54) INTEGRATED CIRCUIT TRANSPONDER HAVING A PLURALITY OF HIGH-GAIN RADIO FREQUENCY SIGNAL INPUTS

(75) Inventors: Willem Smit, Chandler, AZ (US); Pieter Schieke, Phoenix, AZ (US); Willem J. Marneweck, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 416 days.

(21) Appl. No.: 10/358,097

(22) Filed: Feb. 3, 2003

(65) Prior Publication Data

US 2003/0153269 A1     Aug. 14, 2003

Related U.S. Application Data

(63) Continuation-in-part of application No. 09/217,691, filed on Dec. 21, 1998, now Pat. No. 6,516,182.

(51) Int. Cl.
*H04B 1/40* (2006.01)

(52) U.S. Cl. .............................. 455/234.1; 455/343.1; 455/291; 455/292; 455/341

(58) Field of Classification Search ........... 455/41.1–3, 455/334, 341, 343.1, 2, 269, 272, 280, 291, 455/292, 232.1, 234.1, 132, 240.1; 342/42; 327/530
See application file for complete search history.

(56) References Cited

U.S. PATENT DOCUMENTS 5,347,280 A * 9/1994 Schuermann ................ 342/42
5,889,426 A * 3/1999 Kawakami et al. ......... 327/530

* cited by examiner

*Primary Examiner*—Matthew D. Anderson
*Assistant Examiner*—Philip J. Sobutka
(74) *Attorney, Agent, or Firm*—Baker Botts L.L.P.

(57) ABSTRACT

A high gain input stage for a radio frequency transponder uses an amplifier for increasing a magnitude of an input signal. A DC bias circuit is used for controlling the operation of the amplifier. A resonant circuit is coupled between the amplifier and the DC bias circuit. The resonant circuit is used for receiving a signal generated by an electromagnetic field and for generating the input signal which is amplified by the amplifier. The resonant circuit has an inductor which is used to bias the amplifier thereby removing the need for a decoupling capacitor between the tuned circuit and the DC biasing of the amplifier. Multiple transponder inputs may be implemented in a single integrated circuit package.

14 Claims, 5 Drawing Sheets

INTEGRATED CIRCUIT TRANSPONDER HAVING A PLURALITY OF HIGH-GAIN RADIO FREQUENCY SIGNAL INPUTS

RELATED PATENT APPLICATION

This patent application is a continuation-in-part of commonly owned patent application Ser. No. 09/217,691 now U.S. Pat. No. 6,516,182, entitled "High Gain Input Stage for a Radio Frequency Identification (RFID) Transponder and Method Therefor," filed Dec. 21, 1998, and is incorporated by reference herein.

BACKGROUND OF THE INVENTION

This invention relates generally to integrated circuit radio frequency transponders, and more particularly, to an integrated circuit radio frequency transponder having a plurality of high-gain radio frequency signal input connections for externally connected resonant frequency tuned circuits.

DESCRIPTION OF THE RELATED TECHNOLOGY

Radio frequency transponders may be used in managing inventory, automatic identification of cars on toll roads, building entry, security systems, keyless electronic access and entry devices, and the like. A transponder generally comprises a radio frequency receiver and a radio frequency transmitter and communicates with another related transponder by either first receiving a coded signal and then responding back with a coded transmitted signal, or transmitting a coded signal first then waiting for the correct response to be returned from the related transponder. Any combination of coded signal "handshakes" may be utilized by two transponders trying to identify a "friend" or "foe." Once a friendly coded signal is identified and verified a desired action may be taken, i.e., unlocking a car door, opening a garage door, or building access or egress.

An example of a transponder system is the KEELOQ® (a registered trademark of Microchip Technology Inc.) Code Hopping Encoder and Transponder, part number HCS412 by Microchip Technology Inc., more fully described in Specification DS41099A (1999), available at http://www.microchip.com, and incorporated by reference herein.

Typically, the transponder amplitude modulates a CW RF carrier of an RF generator with a data word bitstream in accordance with the binary values of that data word bitstream. The data word bitstream is a series of on/off pulses which represent, for example, a serial data word synchronization header, a tag number, etc. Parity bits or a checksum value may also be incorporated into the data word bitstream. These series of on/off pulses are received by the related transponder. The transponder may use different frequency ranges for receive and transmit (low frequency and high frequency), and/or may use either low or high frequencies depending on the range that the transponder is from the related transponder with which it is being utilized.

It is desirable to have sensitive radio frequency inputs into the transponder. In order to do this, one must amplify the input signals from a tuned inductor-capacitor (L-C) circuit acting as an antenna for the desired radio frequency signal. Presently, most input stages require the use of a decoupling capacitor coupled to the L-C circuit. The decoupling capacitor is required to isolate the DC bias component generated by the amplifying circuit from the external L-C circuit. It is desirable to isolate the DC bias component since one does not want the DC component to be short-circuited to ground via the inductor element of the external L-C circuit. Furthermore, the problem with using a decoupling capacitor is that the decoupling capacitor that is required is very large and consumes valuable silicon real estate.

Therefore, a need exists to provide improved high gain input stages for a radio frequency transponder. The improved high gain input stages must require fewer components to implement than prior art input stages. Therefore, improved high gain input stage must not require a decoupling capacitor. The improved high gain input stages must allow an automatic gain control circuit to be easily integrated therein. The improved high gain input stages must further have low current consumption.

SUMMARY OF THE INVENTION

The invention overcomes the above-identified problems as well as other shortcomings and deficiencies of existing technologies by providing in an integrated circuit package a transponder having a plurality of high-gain radio frequency inputs. The transponder embodiment of the present invention may be used in security and access devices for unlocking and opening automobile doors, home and office doors, garage doors, security gates and the like. The present invention enables hands-free operation of locks, doors and the like. Since the transponder is able to receive a low power radio frequency signal, verification and activation of the lock or door may occur from a distance and without having to remove the transponder system from ones pocket, purse, or briefcase.

It is contemplated herein and within the scope of the present invention that an integrated circuit package comprises a plurality of transponder circuits connected to a plurality of associated resonant frequency tuned circuits without requiring a decoupling capacitor. Typical receive or input signal frequencies may be from about 100 kHz to about 14 MHz, and a transmitted output frequency may be from about 100 kHz to well into the ultra high frequency (UHF) range.

In accordance with one embodiment of the present invention, high gain input stages for a radio frequency transponder are disclosed. The high gain input stages use amplifiers for increasing the magnitude of input signals. A DC bias circuit is used for controlling the operation of these amplifiers. Resonant circuits are coupled between the amplifiers and the DC bias circuit. The resonant circuits are used for receiving signals generated by an electromagnetic field and for generating the input signals which are sent to the amplifiers. DC bias to the amplifiers are coupled through the DC resistance of the inductors of the resonant circuits. In another embodiment, each amplifier has its own DC bias circuit coupled through the DC resistance of the respective inductor of the respective resonant circuit.

The present invention provides an apparatus for a radio frequency transponder having a plurality of high gain inputs, comprising a plurality of amplifiers for increasing magnitudes of a plurality of input signals; a DC bias circuit for controlling operation of said plurality of amplifiers; and a plurality of resonant circuits coupled between respective ones of said plurality of amplifiers and said DC bias circuit, said plurality of resonant circuits adapted for receiving signals generated by electromagnetic fields and for generating said input signals to said plurality of amplifiers wherein a respective inductor of said plurality of resonant circuits is used to couple said DC bias circuit to each of the respective ones of said plurality of amplifiers.

The present invention further provides an apparatus for a radio frequency transponder having a plurality of high gain inputs, comprising a plurality of amplifiers for increasing magnitudes of a plurality of input signals; a plurality of DC bias circuits for controlling operation of said plurality of amplifiers; and a plurality of resonant circuits coupled between respective ones of said plurality of amplifiers and respective ones of said plurality of DC bias circuits, said plurality of resonant circuits adapted for receiving signals generated by electromagnetic fields and for generating said input signals to said plurality of amplifiers wherein a respective inductor of said plurality of resonant circuits is used to couple the respective one of said plurality of DC bias circuits to each of respective one of said plurality of amplifiers.

Each of said plurality of amplifiers may comprise a current source; and a first transistor having a first terminal coupled to said current source, a second terminal coupled to said resonant circuit, and a third terminal coupled to a common supply. Each of said plurality of amplifiers may further comprise an adjustable gain element having a first terminal coupled to said third terminal of said first transistor and a second terminal coupled to the common supply; and an automatic gain control circuit having an input coupled to said first terminal of said first transistor and an output coupled to said adjustable gain element. The adjustable gain element may be a current controlled resistor. The adjustable gain element may be a voltage controlled resistor. The DC bias circuit may comprise a bias current source; and a second transistor having a first terminal coupled to said bias current source, a second terminal coupled to said resonant circuit and to said first terminal of said second transistor, and a third terminal coupled to the common supply. Each of said plurality of resonant circuits may comprise an inductor; and a capacitor coupled in parallel with said inductor.

The present invention provides a method of providing DC bias to a plurality of high gain input stages of a radio frequency transponder, said method comprising the steps of controlling operation of a plurality of amplifier with a DC bias circuit by coupling the DC bias circuit to each of said plurality of amplifiers with respective ones of a plurality of resonant circuits, wherein the respective ones of said plurality of resonant circuits are coupled between said amplifier and said DC bias circuit for receiving signals generated by electromagnetic fields and for generating said input signal to each of said plurality of amplifiers wherein inductors of said plurality of resonant circuits couple DC bias each of said plurality of amplifiers.

A technical advantage of the present invention is a plurality of improved high gain input stages for a radio frequency transponder. Another technical advantage is an improved high gain input stage for a transponder which requires fewer components than prior art input stages. Still another technical advantage is an improved high gain input stage biasing circuit for a transponder that does not require a decoupling capacitor. Another technical advantage is an improved high gain input stage for an integrated circuit transponder wherein an automatic gain control circuit may be easily integrated therein. Yet another technical advantage is an improved high gain input stage for a transponder that has low current consumption.

A feature of the present invention is a space diversity or voting system having a plurality of transponders. An advantage of the present invention is a reduction of the number of input-output pins required for operation of a bi-directional transponder in an integrated circuit.

Features and advantages of the invention will be apparent from the following description of presently preferred embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein.

Figure 1:
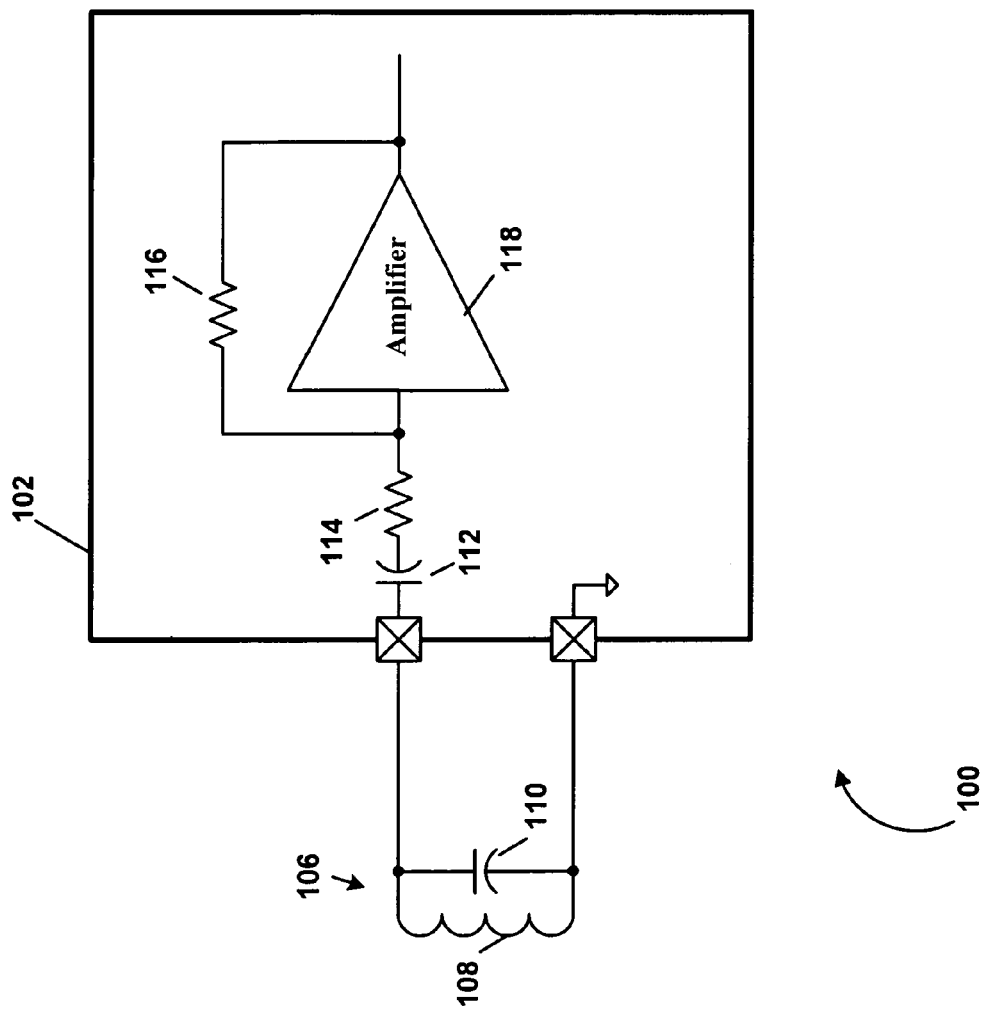
FIG. 1 is a simplified electrical schematic of a prior art high gain input stage.

The present invention may be susceptible to various modifications and alternative forms. Specific exemplary embodiments thereof are shown by way of example in the drawing and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF THE PREFERRED EMBODIMENTS

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, depicted is a prior art high gain input stage for a transponder, the input stage thereof, generally represented by the numeral 100, is illustrated. The input stage 100 comprises an amplifier 118 on an integrated circuit die 102 that is coupled to an external (from the die 102) inductor-capacitor (L-C) tuned circuit 106. The external L-C tuned circuit 106 comprises an inductor 108 coupled in parallel with a capacitor 110. The external L-C tuned circuit 106 is adapted to receive a signal generated by an electromagnetic field (not shown) at a radio frequency approximately the same as the frequency at which the circuit 106 is tuned. The L-C circuit 106 will generate an radio frequency (RF) voltage induced by the electromagnetic field. The RF voltage from the L-C circuit 106 is then coupled to a decoupling capacitor 112. A first feedback resistor 116 is coupled to an output and an input of the amplifier 118. A second resistor 114 is also coupled to the first input of the amplifier 118. The first resistor 116 and the second resistor 114 are used to set the voltage gain of the amplifier 118.

The decoupling capacitor 112 is also coupled to the second resistor 114 which is at the signal input of the amplifier 118. The decoupling capacitor 112 is required because the amplifier 118 requires to be biased at a certain voltage level to achieve optimal gain. Furthermore, the decoupling capacitor 112 is required to isolate a DC bias component generated by the amplifier 118 from the external L-C circuit 106 since the DC component cannot be short-circuited via the DC resistance of inductor 108. As stated above, a problem with using the decoupling capacitor 112 is that the decoupling capacitor 112 that is required is very large and it consumes valuable silicon real estate of the integrated circuit die 102.

Figure 2:
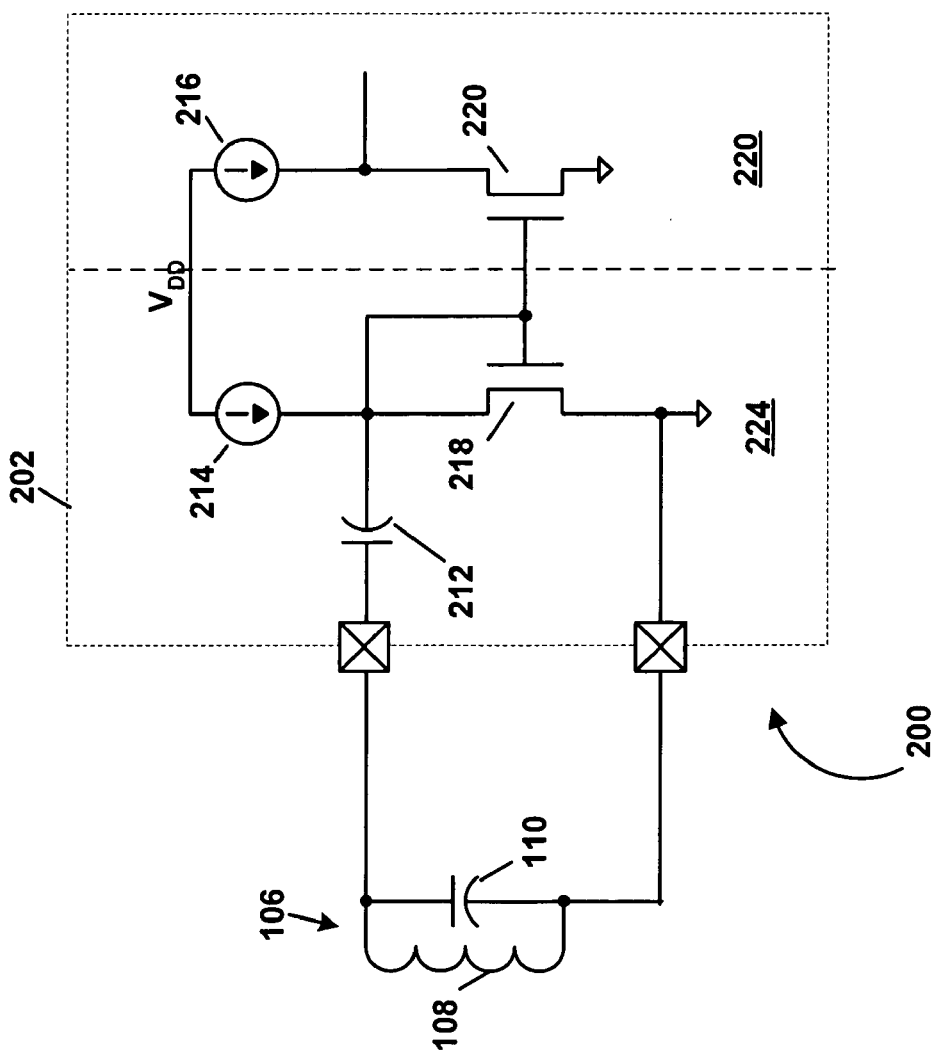
FIG. 2 is a simplified electrical schematic of another prior art high gain input stage.

Referring to FIG. 2, depicted is another prior art high gain input stage for a transponder, the input stage thereof, generally represented by the numeral 200, is illustrated. The amplifier 200 comprises a gain transistor 220 and a current source 216. The current source 216 has a first terminal coupled to a voltage source $V_{DD}$. A second terminal of the current source 216 is coupled to the gain transistor 220. The transistor 220 has three terminals. The first terminal of transistor 220 is coupled to the current source 216. The second terminal of the transistor 220 is coupled to a bias circuit 224. The third terminal of the transistor 220 is coupled to a common voltage connection of the integrated circuit 202.

The bias circuit 224 is used to control the operation of the amplifier 222 by biasing the transistor 220 to a desired threshold voltage. The bias circuit 224 is comprised of a current source 214 and a transistor 218. The current source 214 has a first terminal coupled to the voltage source $V_{DD}$. A second terminal of the current source 214 is coupled to the transistor 218. A first terminal of transistor 218 is coupled to the current source 214. The second terminal of the transistor 218 is coupled to the first terminal of transistor 220. The third terminal of the transistor 218 is coupled to a common voltage connection of the integrated circuit 202.

Like the prior art input stage 100 shown in FIG. 1, the input stage 200 has an external inductor-capacitor (L-C) circuit 106. The external L-C circuit 106 will pick up a signal generated by an electromagnetic field. The L-C circuit 106 will generate a voltage after receiving the signal that was generated by the electromagnetic field. The voltage signal generated by the L-C circuit 106 is then fed into the amplifier 222.

A decoupling capacitor 212 is coupled to the bias circuit 224 and the amplifier 222. The decoupling capacitor 212 is required to isolate the DC bias component generated by the bias circuit 224 from the L-C circuit 106 since one does not want the DC component to be short-circuited via the DC resistance of the inductor 108. As stated above, the problem with using the decoupling capacitor 212 is that the decoupling capacitor 212 requires a very large amount of valuable silicon real estate on the integrated circuit die 202.

Figure 3:
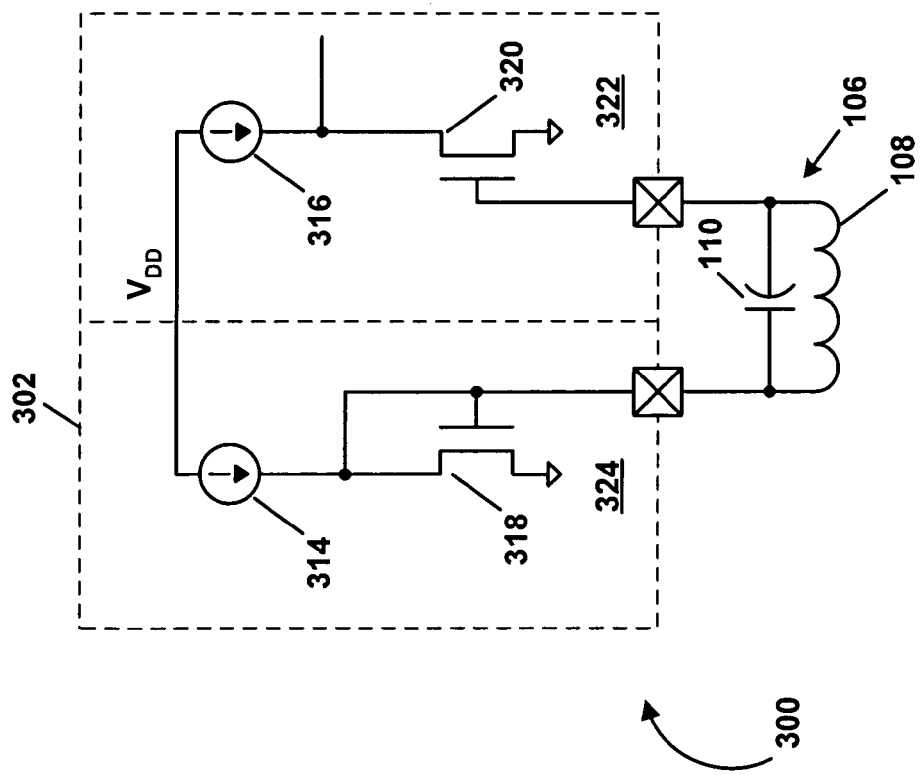
FIG. 3 is a simplified electrical schematic of an exemplary embodiment of a high gain input amplifier, according to the present invention.

Referring to FIG. 3, depicted is a high gain input stage for a transponder, the input stage thereof, generally represented by the numeral 300, is illustrated. The input stage 300 is unique in that the decoupling capacitor of the prior art is no longer required. This is accomplished by including the external L-C circuit 106 as part of the amplifier/DC bias circuit. Furthermore, the input stage 300 requires fewer components to implement, thereby saving valuable silicon real estate. The input stage 300 is biased through the DC resistance of the inductor 108, as stated above.

The input stage 300 uses a very simple amplifier 322. The amplifier 322 is a single transistor amplifier comprising a transistor 320 and a current source 316. The current source 316 has a first terminal coupled to a voltage source $V_{DD}$. A second terminal of the current source 316 is coupled to the transistor 320. The transistor 320 has three terminals. The first terminal of transistor 320 is coupled to the current source 316. The second terminal of the transistor 320 is coupled to the L-C circuit 106. The third terminal of the transistor 66 is coupled to a common voltage connection of the integrated circuit 302.

A DC bias circuit 324 is coupled to the L-C circuit 106. The DC bias circuit 324 is used to control the operation of the amplifier 322 by DC biasing the amplifier 322 to the amplifier's threshold voltage via the L-C circuit 108. The DC bias circuit 324 is comprised of a current source 314 and a transistor 318. The current source 314 has a first terminal coupled to a voltage source $V_{DD}$. A second terminal of the current source 314 is coupled to the transistor 318. The transistor 318 has three terminals. The first terminal of transistor 318 is coupled to the current source 314. The second terminal of the transistor 314 is coupled to the first terminal of the transistor 318. The third terminal of the transistor 318 is coupled to a common voltage connection of the integrated circuit 302.

The L-C circuit 106 is coupled in between the amplifier 322 and the DC bias circuit 324. The L-C circuit 108 is comprised of an inductor 108 coupled in parallel with a capacitor 110 to form a parallel resonant circuit at a desired frequency. The L-C circuit 108 now forms part of the amplifier-DC bias circuit (e.g., input stage of the amplifier 322). The biasing of the amplifier 322 now flows through the DC resistance of the inductor 108 so that the amplifier 322 is biased at a desired DC operating voltage level. Therefor, the prior art decoupling capacitor is no longer required.

Figure 4:
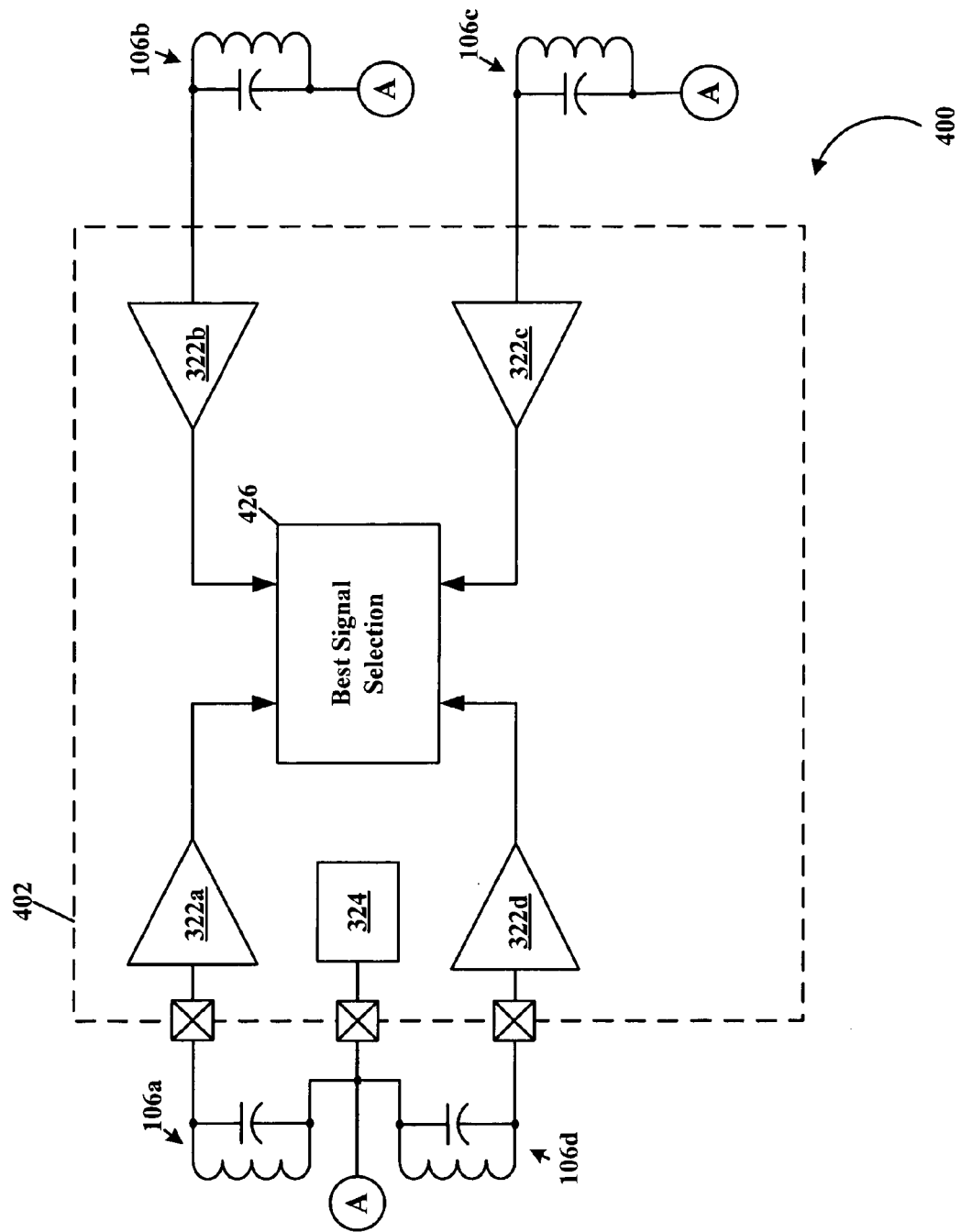
FIG. 4 is a schematic block diagram of an exemplary embodiment of the invention using the high gain input amplifier of FIG. 3.

Referring to FIG. 4, depicted is a schematic block diagram of a multiple channel embodiment of the invention. A transponder having a plurality of signal inputs for a plurality of different channels is generally indicated by the numeral 400. According to this embodiment of the present invention, the transponder 400 comprises high gain signal amplifiers 322a–322d, a common DC bias circuit 324 for the amplifiers 322a–322d, best signal selection circuit 426, and parallel tuned circuits 106a–106d. The signal returns of the parallel tuned circuits 106a–106d are connected in common and coupled to the DC bias circuit 324. Using this common connection reduces the number of external connections required of the integrated circuit die 402. The best signal selection circuit may be used for selection of a strongest received signal.

The parallel tuned circuits 106a–106d are adapted to receive electromagnetic or radio frequency (RF) energy from a plurality of signal sources which may be at different operating frequencies and contain independent information from each of the plurality of signal sources. The received energies are in the form of alternating current (AC) signals which are coupled to and amplified by the amplifiers 322a–322d. The amplified signals from the outputs of the amplifiers 322a–322d may be detected (demodulated) in signal detectors (not shown). The demodulated information signals from the signal detectors may be processed in logic circuits (not illustrated). Four information channels are illustrated for clarity, however, it is contemplated and within the scope of the present invention that any number of information channels may be received and processed by an embodiment of the present invention.

Figure 5:
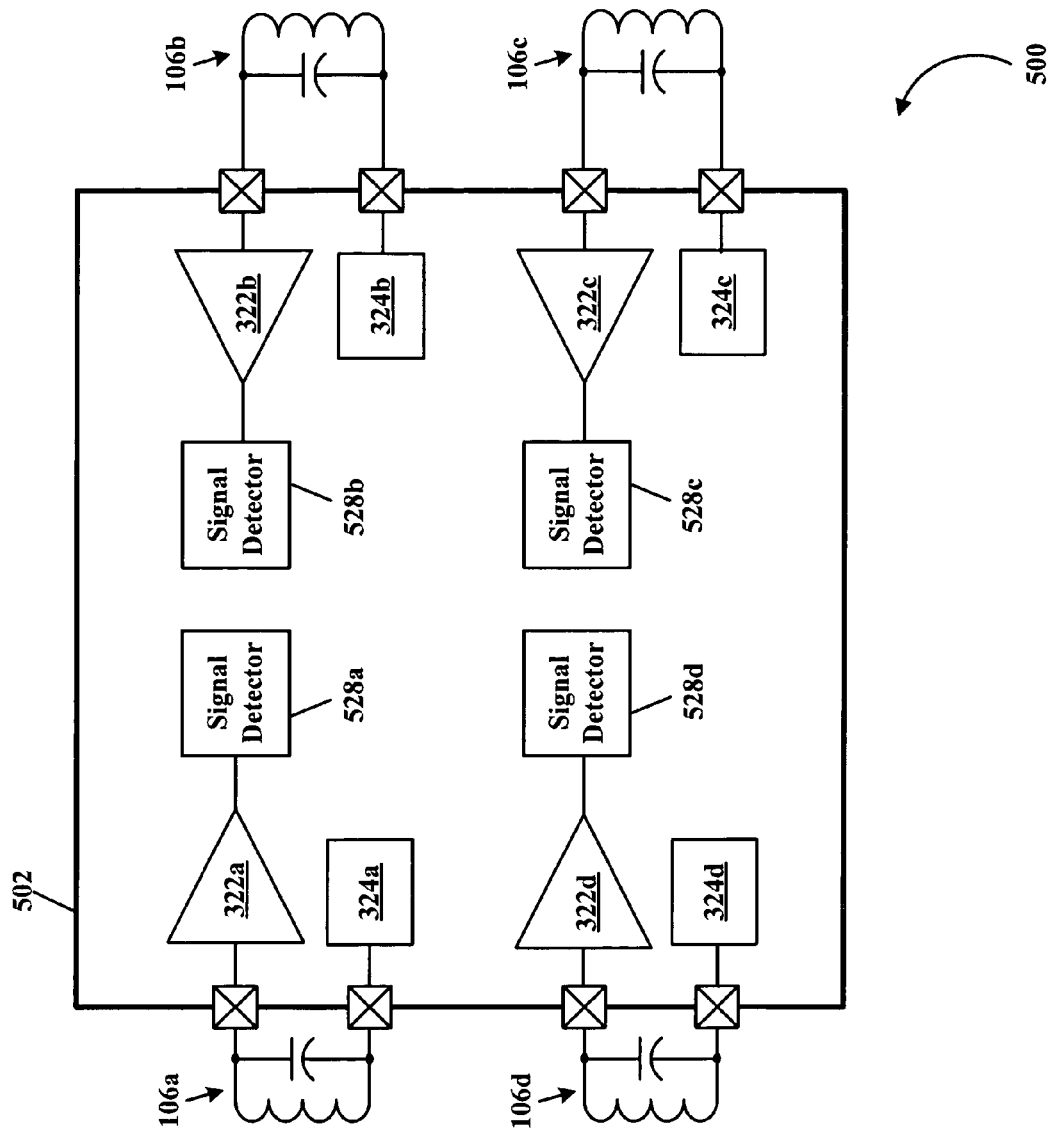
FIG. 5 is a schematic block diagram of another exemplary embodiment of the invention using the high gain input amplifier of FIG. 3.

Referring now to FIG. 5, depicted is a schematic block diagram of a multiple channel embodiment of the invention. A transponder having a plurality of signal inputs for a plurality of different channels is generally indicated by the numeral 500. According to this embodiment of the present invention, the transponder 500 comprises high gain signal amplifiers 322a–322d, separate DC bias circuits 324a–324d for the amplifiers 322a–322d, respectively, signal detectors 428a–428d, and parallel tuned circuits 106a–106d. Each of the parallel tuned circuits 106a–106d are connected to their respective amplifiers 322a–322d, and to the respective DC bias circuits 324a–324d. By using separate DC bias circuits 324a–324d for biasing of the amplifiers 322a–322d, optimized gain for each channel may be configured for specific system requirements.

The parallel tuned circuits 106a–106d are adapted to receive electromagnetic or radio frequency (RF) energy from a plurality of signal sources which may be at different operating frequencies and contain independent information from each of the plurality of signal sources. The received energies are in the form of alternating current (AC) signals which are coupled to and amplified by the amplifiers 322a–322d. The amplified signals from the outputs of the amplifiers 322a–322d may be detected (demodulated) in signal detectors 528a–528d. The demodulated information signals from the signal detectors may be processed in logic circuits (not illustrated). Four information channels are illustrated for clarity, however, it is contemplated and within the scope of the present invention that any number of information channels may be received and processed by an embodiment of the present invention.

The invention, therefore, is well adapted to carry out the objects and to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving fill cognizance to equivalents in all respects.

What is claimed is:

1. A radio frequency transponder having a plurality of high gain inputs, comprising:
   a plurality of amplifiers for increasing magnitudes of a plurality of input signals;
   a DC bias circuit for controlling operation of said plurality of amplifiers; and
   a plurality of resonant circuits coupled between respective ones of said plurality of amplifiers and said DC bias circuit, said plurality of resonant circuits adapted for receiving signals generated by electromagnetic fields and for generating said input signals to said plurality of amplifiers wherein a respective inductor of said plurality of resonant circuits is used to couple said DC bias circuit to each of the respective ones of said plurality of amplifiers.

2. The radio frequency transponder according to claim 1, wherein each of said plurality of amplifiers comprises:
   a current source; and
   a first transistor having a first terminal coupled to said current source, a second terminal coupled to said resonant circuit, and a third terminal coupled to a common supply.

3. The radio frequency transponder according to claim 2, wherein each of said plurality of amplifiers further comprises:
   an adjustable gain element having a first terminal coupled to said third terminal of said first transistor and a second terminal coupled to the common supply; and
   an automatic gain control circuit having an input coupled to said first terminal of said first transistor and an output coupled to said adjustable gain element.

4. The radio frequency transponder according to claim 3, wherein said adjustable gain element is a current controlled resistor.

5. The radio frequency transponder according to claim 3, wherein said adjustable gain element is a voltage controlled resistor.

6. The radio frequency transponder according to claim 1, wherein said DC bias circuit comprises:
   a bias current source; and
   a second transistor having a first terminal coupled to said bias current source, a second terminal coupled to said resonant circuit and to said first terminal of said second transistor, and a third terminal coupled to the common supply.

7. The radio frequency transponder according to claim 1, wherein each of said plurality of resonant circuits comprises;
   an inductor; and
   a capacitor coupled in parallel with said inductor.

8. A radio frequency transponder having a plurality of high gain inputs, comprising:
   a plurality of amplifiers for increasing magnitudes of a plurality of input signals, wherein each of said plurality of amplifiers comprises a current source and a first transistor having a first terminal coupled to said current source, a second terminal and a third terminal coupled to a common supply;
   a plurality of DC bias circuits for controlling operation of said plurality of amplifiers; and
   a plurality of resonant circuits coupled between said plurality of amplifiers and said plurality of DC bias circuits, said plurality of resonant circuits adapted for receiving signals generated by electromagnetic fields and for generating said input signals to said plurality of amplifiers wherein a respective inductor of said plurality of resonant circuits is used to couple a respective one of said plurality of DC bias circuits to the first transistor second terminal of a respective one of said plurality of amplifiers.

9. The radio frequency transponder according to claim 8, wherein each of said plurality of DC bias circuits comprises:
   a bias current source; and
   a second transistor having a first terminal coupled to said bias current source, a second terminal coupled to said resonant circuit and to said first terminal of said second transistor, and a third terminal coupled to the common supply.

10. The radio frequency transponder according to claim 8, wherein each of said plurality of resonant circuits comprises;
    an inductor; and
    a capacitor coupled in parallel with said inductor.

11. The radio frequency transponder according to claim 8, wherein each of said plurality of amplifiers further comprises:
    an adjustable gain element having a first terminal coupled to said third terminal of said first transistor and a second terminal coupled to the common supply; and
    an automatic gain control circuit having an input coupled to said first terminal of said first transistor and an output coupled to said adjustable gain element.

12. The radio frequency transponder according to claim 11, wherein said adjustable gain element is a current controlled resistor.

13. The radio frequency transponder according to claim 11, wherein said adjustable gain element is a voltage controlled resistor.

14. A method of providing DC bias to a plurality of high gain input stages of a radio frequency transponder, said method comprising the steps of:

controlling operation of a plurality of amplifiers with a DC bias circuit by coupling the DC bias circuit to each of said plurality of amplifiers with respective ones of a plurality of resonant circuits, wherein the respective ones of said plurality of resonant circuits are coupled between said amplifier and said DC bias circuit for receiving signals generated by electromagnetic fields and for generating said input signal to each of said plurality of amplifiers wherein inductors of said plurality of resonant circuits couple DC bias to each of said plurality of amplifiers.

* * * * *